(12) United States Patent
Murata

(10) Patent No.: US 10,211,739 B2
(45) Date of Patent: Feb. 19, 2019

(54) METHODS AND APPARATUS FOR AN INTEGRATED CIRCUIT

(71) Applicant: SEMICONDUCTOR COMPONENTS INDUSTRIES, LLC, Phoenix, AZ (US)

(72) Inventor: Tsutomu Murata, Mizuho (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 15/692,071

(22) Filed: Aug. 31, 2017

(65) Prior Publication Data

US 2019/0006947 A1  Jan. 3, 2019

Related U.S. Application Data

(60) Provisional application No. 62/526,074, filed on Jun. 28, 2017.

(51) Int. Cl.
*H02M 3/158* (2006.01)
*G01R 31/3185* (2006.01)
*G05F 1/618* (2006.01)
*H02H 7/12* (2006.01)
*H02M 3/156* (2006.01)

(52) U.S. Cl.
CPC .. *H02M 3/1588* (2013.01); *G01R 31/318572* (2013.01); *G05F 1/618* (2013.01); *H02H 7/1213* (2013.01); *H02M 3/156* (2013.01)

(58) Field of Classification Search
CPC .................................................. H02M 3/1588
See application file for complete search history.

(56) References Cited

U.S. PATENT DOCUMENTS

| | | |
|---|---|---|
| 2001/0043450 A1 | 11/2001 | Seale |
| 2005/0093611 A1 | 5/2005 | Fujita |
| 2007/0069712 A1 | 3/2007 | Kamatani |
| 2007/0080905 A1 | 4/2007 | Takahara |
| 2007/0247141 A1 | 10/2007 | Pastre |
| 2008/0278098 A1 | 11/2008 | Kamatani |
| 2011/0133723 A1 | 6/2011 | Forsyth |
| 2014/0009146 A1 | 1/2014 | Blagojevic |
| 2016/0377690 A1 | 12/2016 | Huber |
| 2017/0080820 A1* | 3/2017 | Sun ........................ G01R 31/36 |

FOREIGN PATENT DOCUMENTS

| | | |
|---|---|---|
| JP | H08-329425 A | 12/1996 |
| JP | 2011-045149 A | 3/2011 |
| JP | 2017-063106 A | 3/2017 |

* cited by examiner

*Primary Examiner* — Daniel Puentes
(74) *Attorney, Agent, or Firm* — The Noblitt Group, PLLC; Hettie L. Haines

(57) ABSTRACT

Various embodiments of the present technology may comprise methods and apparatus for an integrated circuit (IC). The methods and apparatus may comprise an integrated circuit comprising a sensor circuit and a driver circuit coupled to the sensor circuit. The driver circuit may include an amplifier configured to generate a bias voltage, a signal converter circuit coupled to the amplifier, and a control circuit coupled to the amplifier. The control circuit may comprise a switch responsive to a control signal and a transistor coupled to the switch.

20 Claims, 11 Drawing Sheets

METHODS AND APPARATUS FOR AN INTEGRATED CIRCUIT

CROSS-REFERENCE TO RELATED APPLICATION

This application claims the benefit of U.S. Provisional Patent Application Ser. No. 62/526,074, filed on Jun. 28, 2017, and incorporates the disclosure of the application in its entirety by reference.

BACKGROUND OF THE TECHNOLOGY

Various integrated circuits require two digital-to-analog converters (DACs)—one to provide a current output and one to provide a voltage output. For example, in a sensor integrated circuit (IC), the current output DAC may be required to adjust the sensitivity of the sensor and the voltage output DAC may be required to adjust an offset voltage. While a current output DAC is the same as a voltage output DAC in terms of the corresponding output being a function of the applied digital input code, the current DAC "steers" the full scale current while the voltage output DAC simply provides an output proportional to an applied voltage reference. Integrating both DACs into a circuit, however, increases the overall size of the IC, which may be problematic in applications that have limited chip space, such as in portable electronics. Further, integrating both DACs into the IC also increases the overall cost and power consumption of the sensor IC.

SUMMARY OF THE INVENTION

Various embodiments of the present technology may comprise methods and apparatus for an integrated circuit (IC). The methods and apparatus may comprise an integrated circuit comprising a sensor circuit and a driver circuit coupled to the sensor circuit. The driver circuit may include an amplifier configured to generate a bias voltage, a signal converter circuit coupled to the amplifier, and a control circuit coupled to the amplifier. The control circuit may comprise a switch responsive to a control signal and a transistor coupled to the switch.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various types of switches, transistors, amplifiers, signal converters, sampling circuits, hall elements, sensors, and the like, which may carry out a variety of functions. In addition, the present technology may be practiced in conjunction with any number of applications, and the apparatus described is merely one exemplary application for the technology. Further, the present technology may employ any number of conventional techniques for providing a supply voltage, transmitting control signals, sampling signals, and the like.

Figure 1:
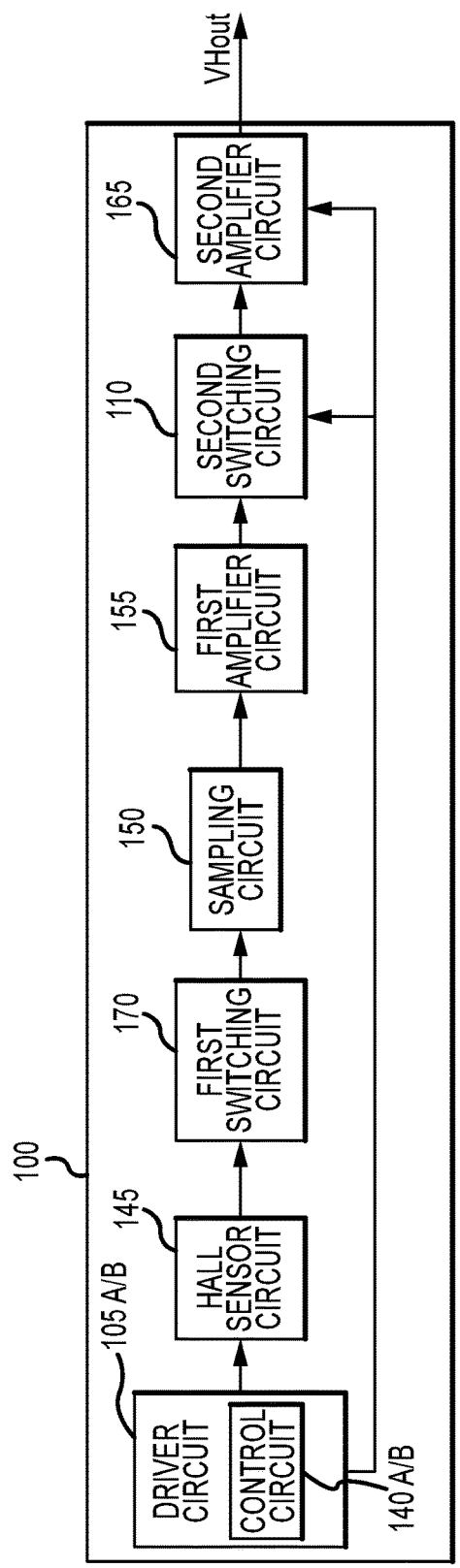
FIG. 1 is a block diagram of a sensor IC in accordance with an exemplary embodiment of the present technology.

Various aspects of the present technology may be used in conjunction with any suitable circuit and/or system where current and voltage control is desired, such as a system with one or more sensors. Referring now to FIG. 1, in an exemplary embodiment of the present technology, a sensor IC 100 may be configured to generate a sensor signal, sample the sensor signal, and/or amplify the sensor signal. The sensor IC 100 may be configured to operate in a current mode and a voltage mode. The sensor IC 100 may comprise various circuits and/or systems configured to control a current and a voltage of various components of the IC. For example, in an exemplary embodiment, the sensor IC 100 may comprise a driver circuit 105A/B, a sensor circuit, such as a hall sensor circuit 145, a first switching circuit 170, a sampling circuit 150, a first amplifier circuit 155, a second switching circuit 110, and a second amplifier circuit 165. In various embodiments, the driver circuit 105 may be capable of generating a constant current and a constant voltage, and the sensor IC 100 may operate in a current mode and a voltage mode, respectively. According to various embodiments, the switching circuit 110 and the control circuit 140A/B may operate in conjunction with each other to provide a first transition period between the current and voltage modes, and a second transition period between the voltage mode and a subsequent current mode.

According to various embodiments, the driver circuit 105A/B may be configured to provide a constant current to control the operation and/or sensitivity of a circuit or device, such as the hall sensor circuit 145, and to provide a constant voltage to control and/or adjust an offset voltage of a circuit or device, such as the second amplifier circuit 165. For example, the driver circuit 105A/B may comprise a control circuit 140A/B to selectively operate the sensor IC 100 in one of a current mode and a voltage mode. The driver circuit 105A/B may further comprise a signal converter 130, such as a digital-to-analog converter configured to convert a digital signal into an analog signal and an amplifier 135.

According to various embodiments, the amplifier 135 may be configured as an operational transconductance amplifier having an inverting terminal (−) and a non-inverting terminal (+). According to various embodiments, the inverting terminal (−) may be coupled to the signal converter 130 and the non-inverting terminal (+) may be coupled to the second amplifier circuit 165. An output terminal of the amplifier 135 may be coupled to a plurality of transistors M1, M2, wherein the transistors M1 and M2 are further coupled to a supply voltage VDD. For example, the output terminal of the amplifier 135 may be coupled to respective gate terminals of the transistors M1, M2.

The amplifier 135 may also be configured to supply a bias voltage to the control circuit 140A/B. For example, the amplifier 135 may be coupled to the control circuit 140A/B via switches S1 and S2, and the switches may be selectively operated (e.g., turned on or off) to supply the bias voltage to a gate terminal of the transistor M3. According to various embodiments, the control circuit 140A/B may be coupled to a bias output terminal of the amplifier 135.

Figure 2:
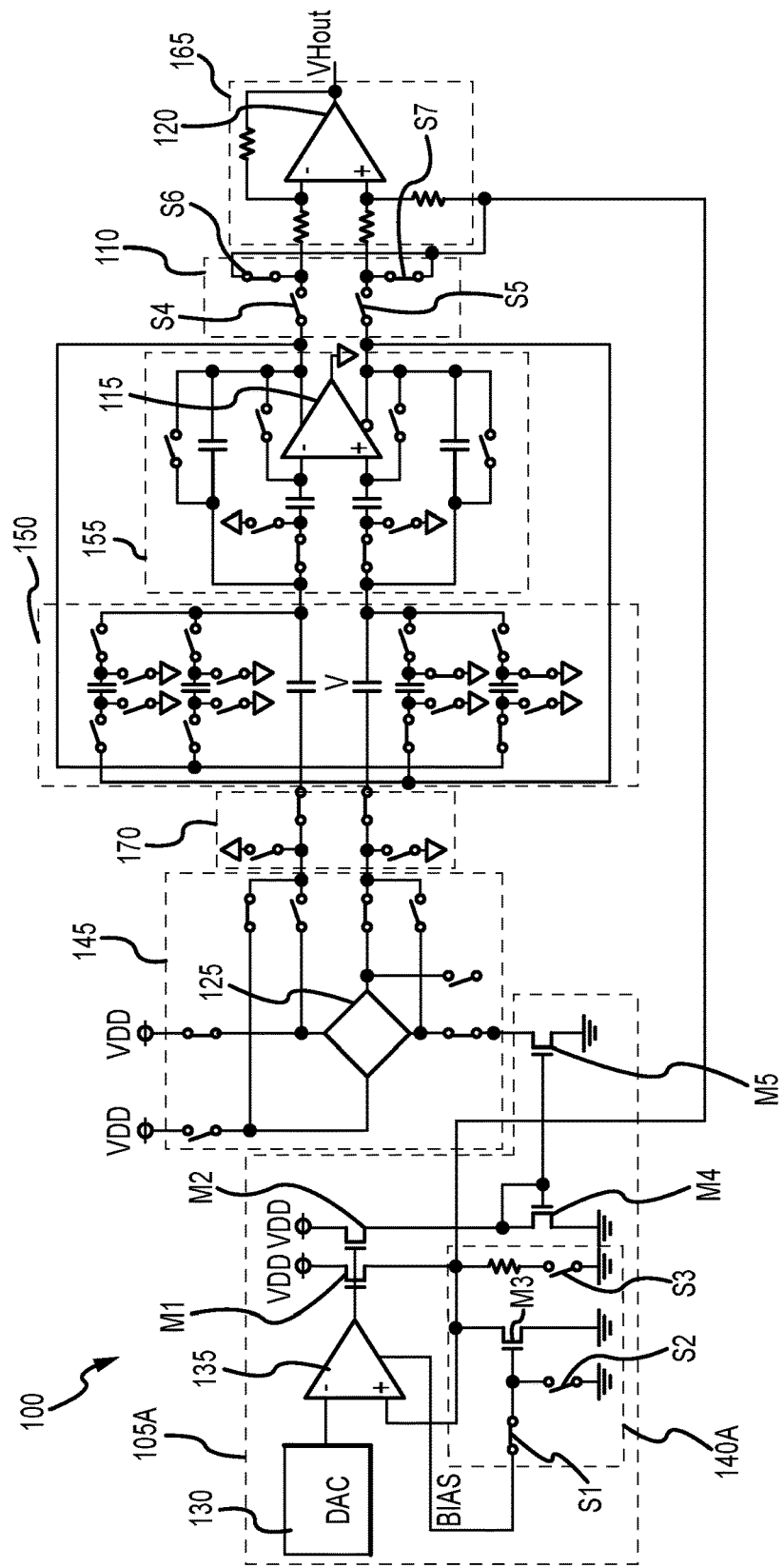
FIG. 2 is a circuit diagram of a sensor IC in accordance with an exemplary embodiment of the present technology.

According to an exemplary embodiment, and referring to FIG. 2, the driver circuit 105A/B may further comprise a current mirror circuit comprising transistors M4 and M5, each transistor comprising a gate terminal and two source/drain terminals (S/D terminals), wherein the current though transistor M5 mirrors the current through transistor M4.

Figure 3:
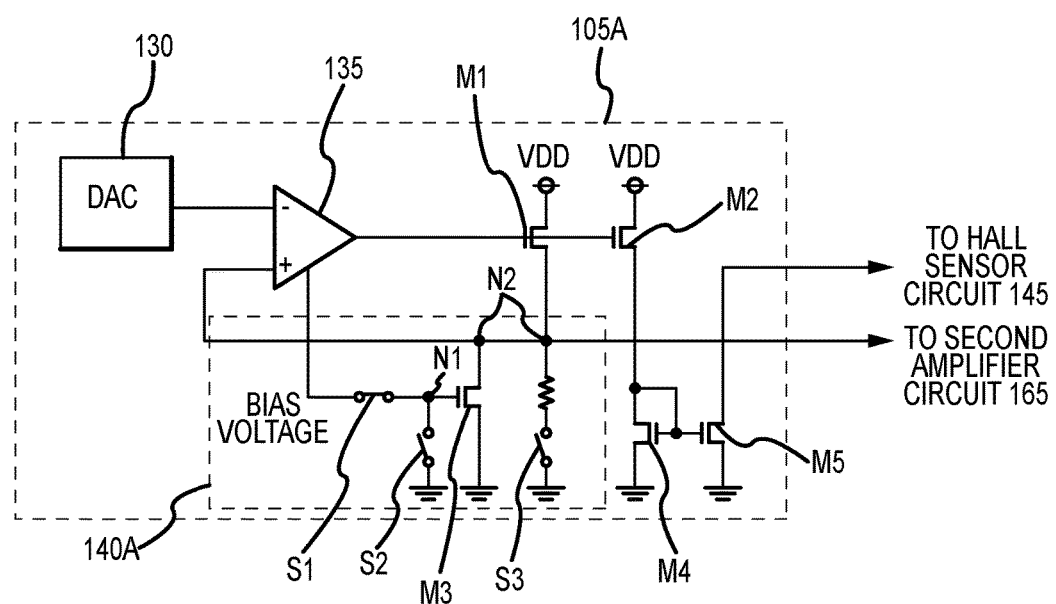
FIG. 3 is a circuit diagram of a driver circuit in a voltage mode in accordance with a first embodiment of the present technology.
Figure 4:
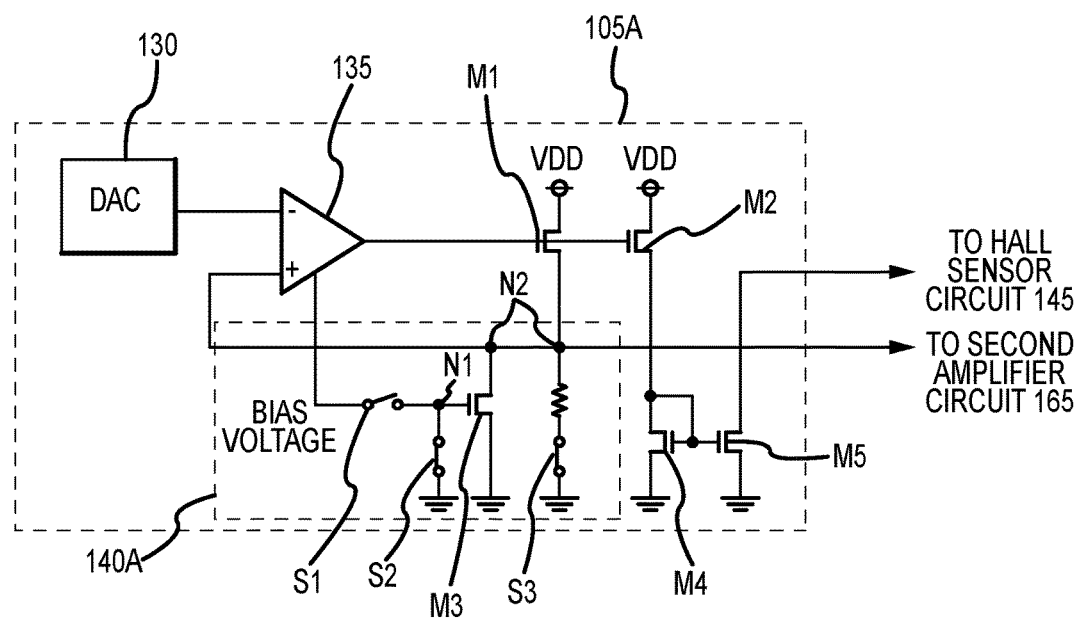
FIG. 4 is a circuit diagram of a driver circuit in a current mode in accordance with the first embodiment of the present technology.
Figure 5:
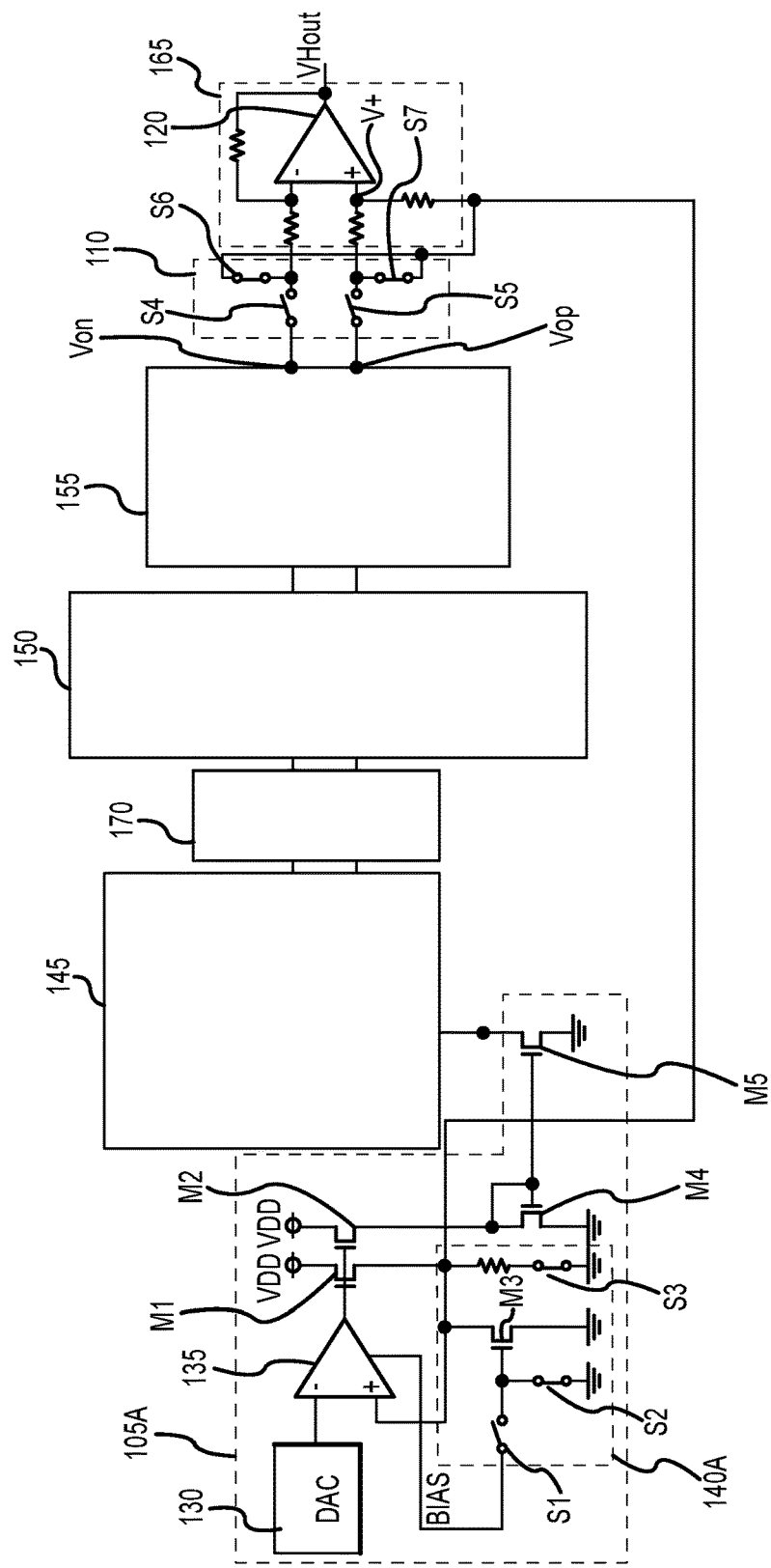
FIG. 5 is a circuit diagram of a sensor IC in a current mode in accordance with the first embodiment of the present technology.
Figure 6:
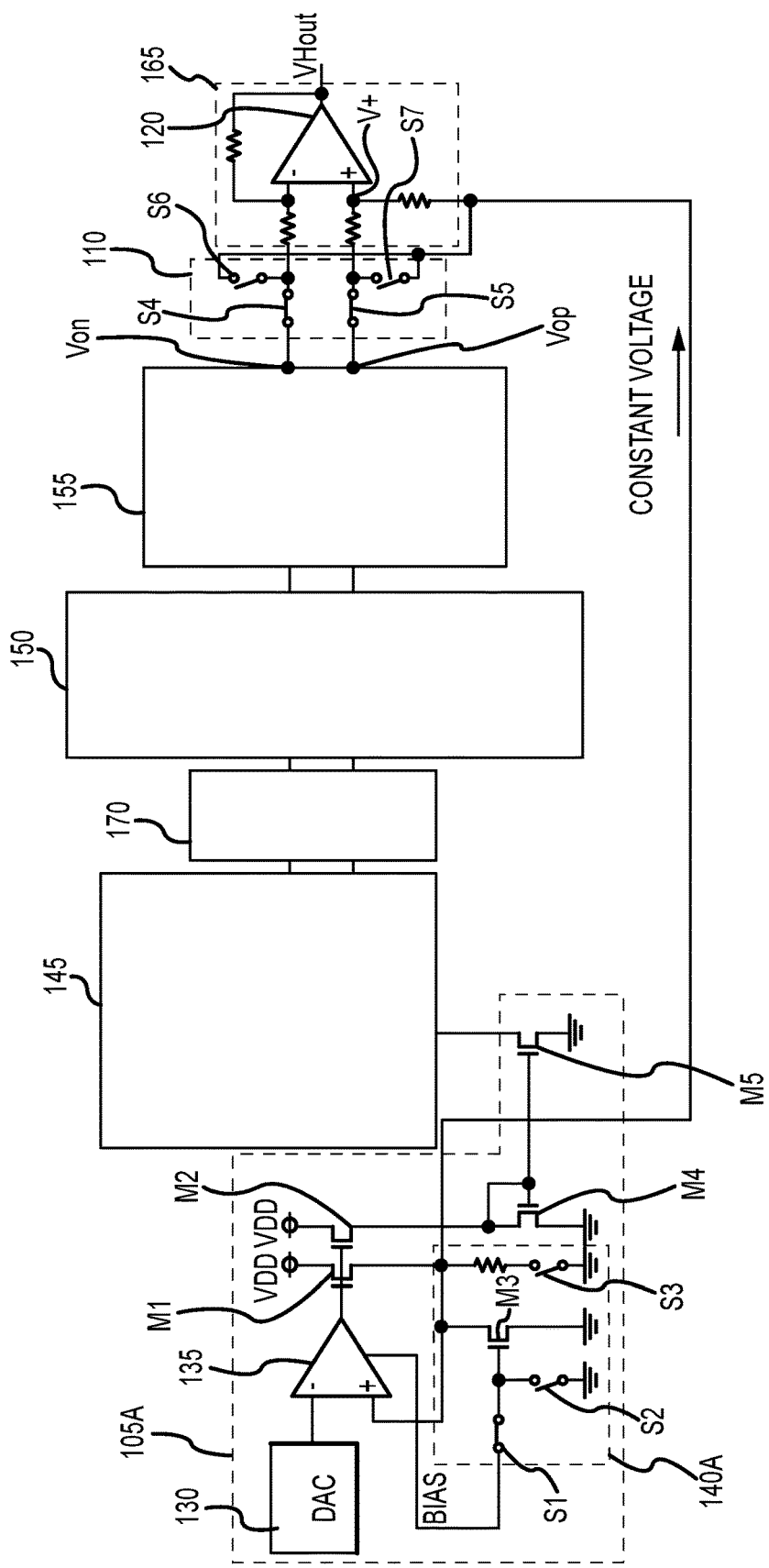
FIG. 6 is a circuit diagram of a sensor IC in a voltage mode in accordance with a first embodiment of the present technology.
Figure 7:
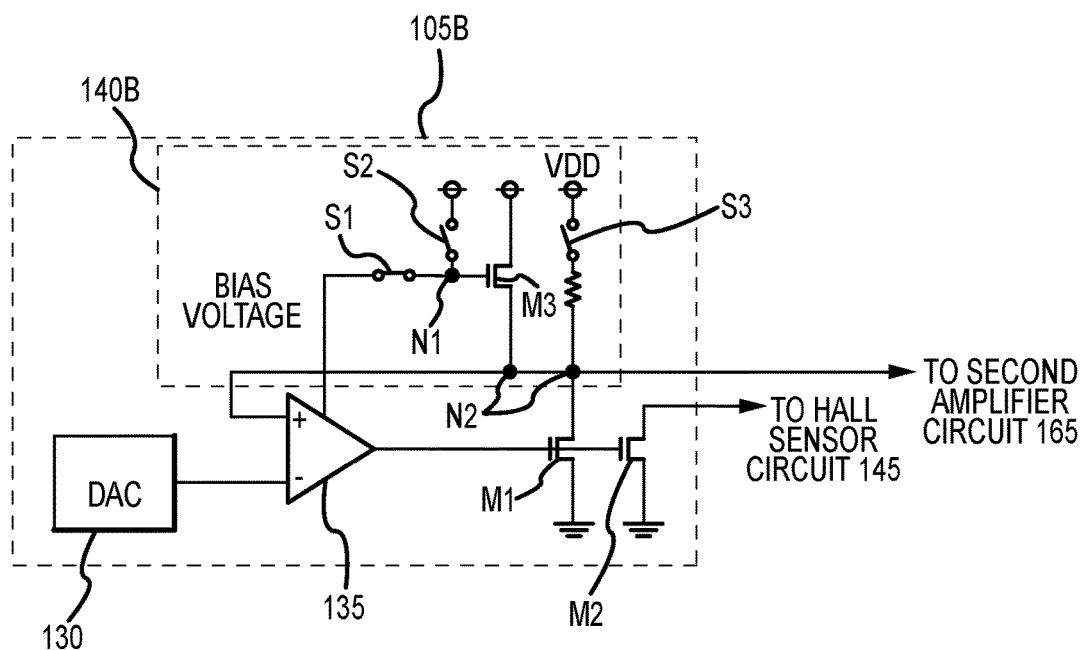
FIG. 7 is a circuit diagram of a driver circuit in a voltage mode in accordance with a second embodiment of the present technology.
Figure 8:
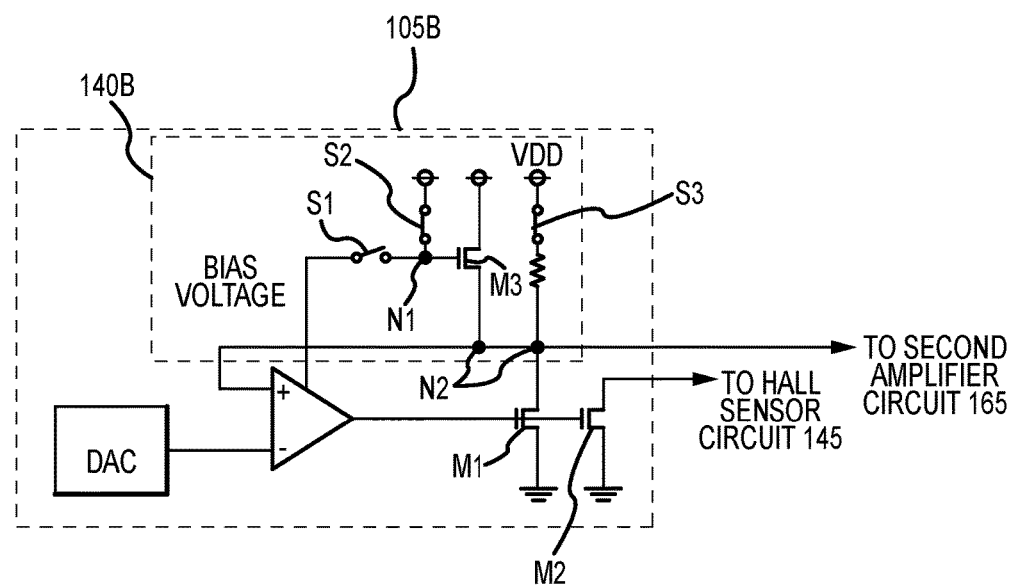
FIG. 8 is a circuit diagram of a driver circuit in a current mode in accordance with a second embodiment of the present technology.
Figure 9:
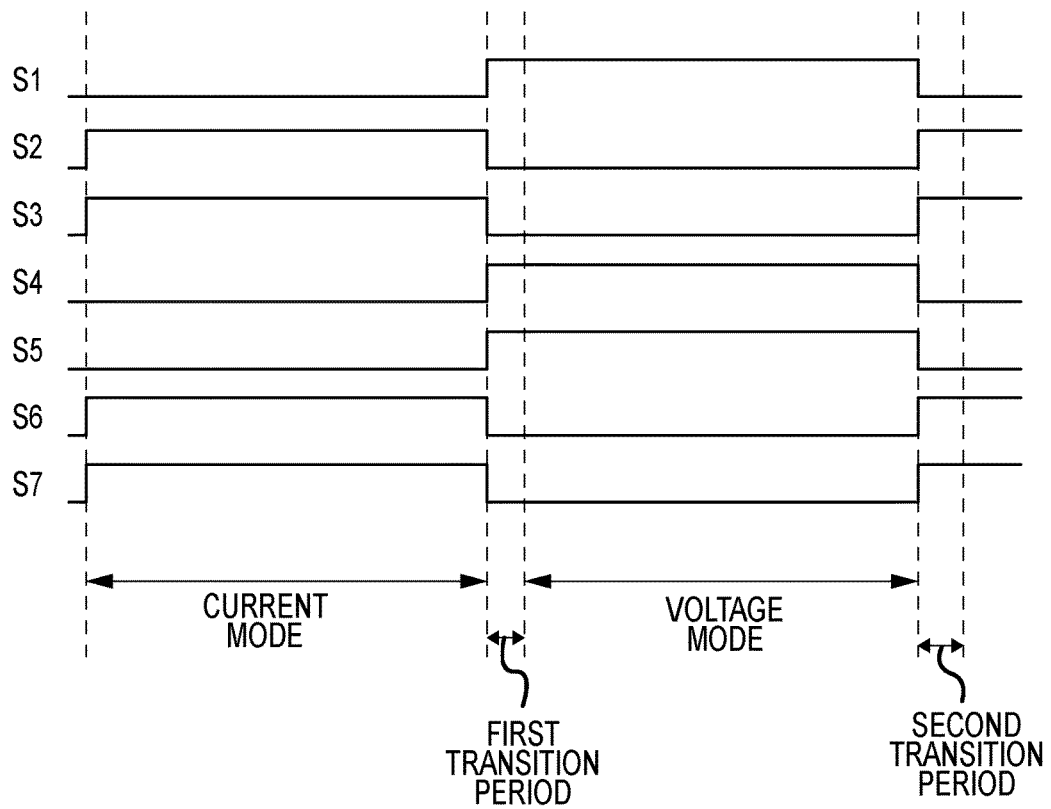
FIG. 9 is a timing diagram of various switches in a sensor IC and corresponding mode in accordance with various embodiments of the present technology.
Figure 10A:
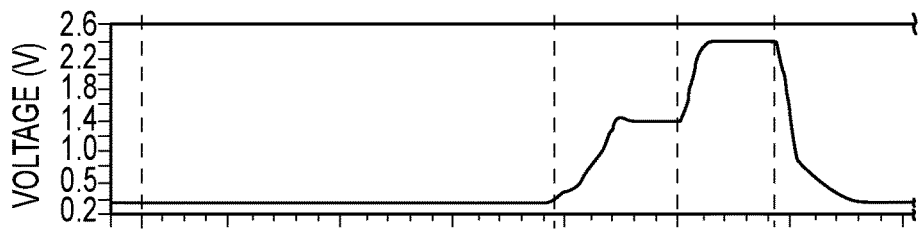
FIG. 10A is an output waveform of a voltage at an output terminal of a sensor IC in accordance with various embodiments of the present technology.
Figure 10B:
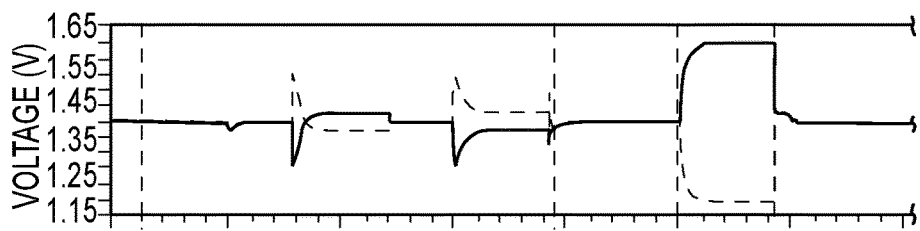
FIG. 10B is an output waveform of a voltage at a first output terminal of an amplifier circuit and a voltage at a second output terminal of the amplifier circuit in accordance with various embodiments of the present technology.
Figure 10C:
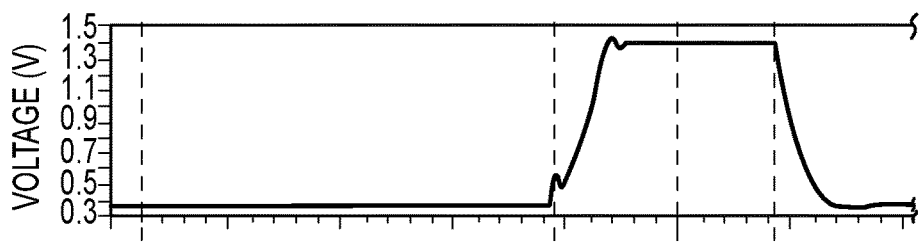
FIG. 10C is a voltage waveform at a non-inverting terminal of a second amplifier circuit in accordance with various embodiments of the present technology.
Figure 10D:
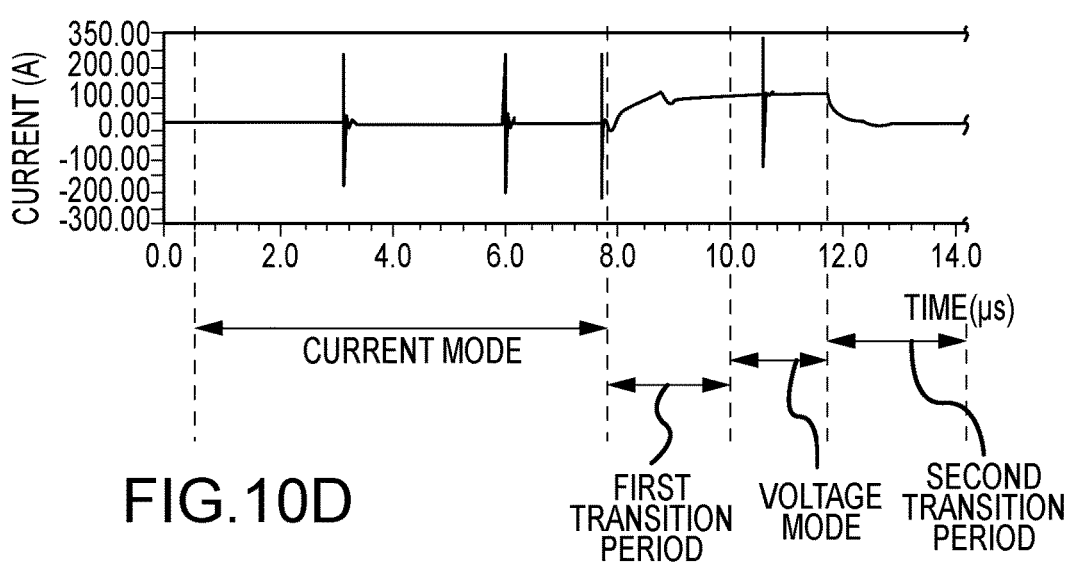
FIG. 10D is a current waveform through a hall sensor circuit in accordance with various embodiments of the present technology.
Figure 10A:
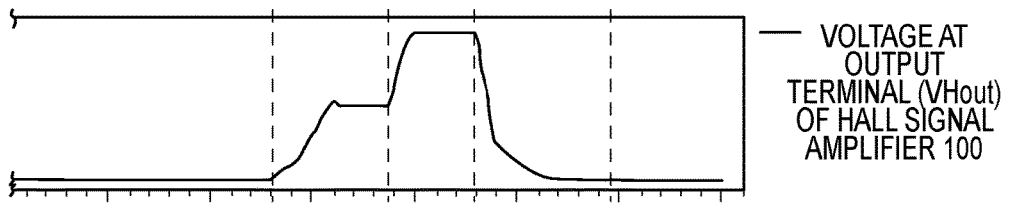
Figure 10B:
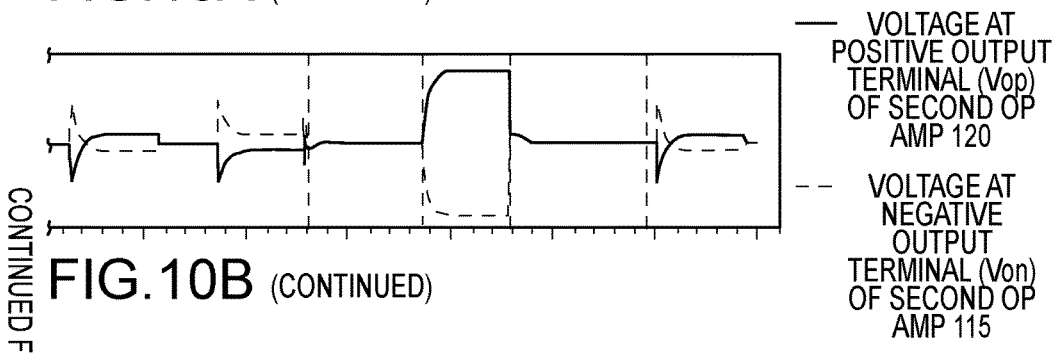
Figure 10C:
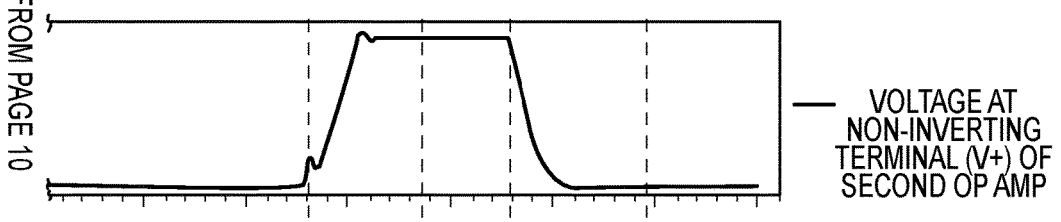
Figure 10D:
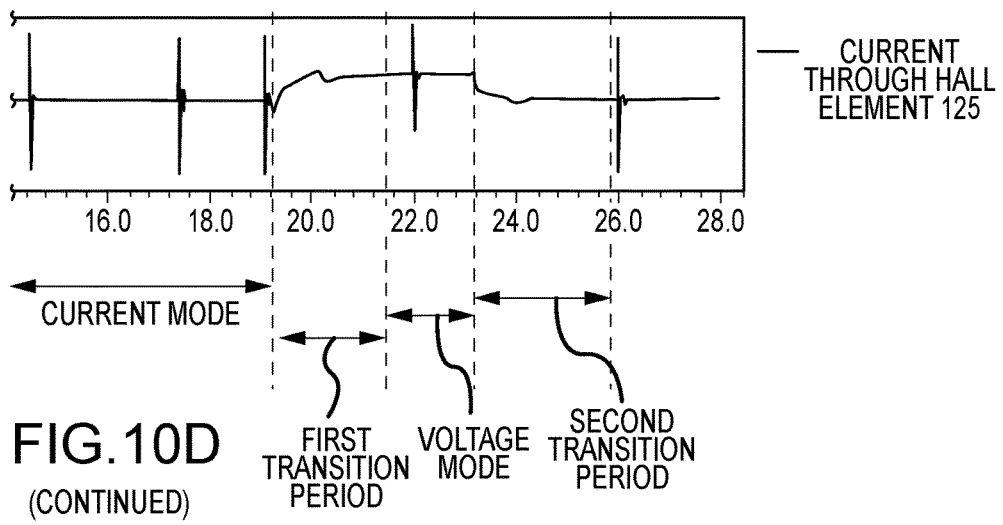

Referring to FIGS. 2, 3, and 7, the control circuit 140A/B may comprise a plurality of switches S1, S2, S3. Each switch S1, S2, S3 may receive a corresponding control signal from a controller (not shown) to selectively open (OFF) or close (ON) each switch S1, S2, S3 according to a desired operation. Each switch S1, S2, S3 may comprise any device and/or circuit suitable for electrically coupling/decoupling various circuit components, such as an analog switch, a transistor, and the like. The control circuit 140A/B may further comprise a transistor M3 to operate in conjunction with the plurality of switches S1, S2, S3 to achieve a desired operation mode. The transistor M3 may comprise a gate terminal and two source/drain terminals. According to one embodiment, for example referring to FIG. 3, the transistor M3 is an N-channel transistor, and in an alternative embodiment, for example referring to FIG. 7, the transistor M3 is a P-channel transistor.

According to various embodiments, switches Si and S2 are coupled in series between a reference voltage and the amplifier 135. For example, and referring to FIG. 3, the reference voltage is the supply voltage VDD. Alternatively, and referring to FIG. 7, the reference voltage is a ground voltage.

According to various embodiments, a gate terminal of transistor M3 may be coupled to a first node N1 located between the switches S1 and S2. The remaining terminals (i.e., the S/D terminals) of the transistor M3 may be coupled to the reference voltage at one S/D terminal and to the non-inverting terminal (+) of the amplifier 135 via a second node N2.

The switch S3 may be coupled to a resistive element, such as a resistor, and the switch S3 together with the resistor may be coupled between the reference voltage and a source/drain terminal of transistor M1. The switch S3 together with the resistor may also be coupled to the non-inverting terminal (+) of the amplifier 135 via the second node N2.

The hall sensor circuit 145 may be configured to generate a hall signal according to changes in a magnetic field. For example, according to an exemplary embodiment, the hall sensor circuit 145 comprises a hall element 125 and a plurality of switches. The switches may be selectively operated to facilitate a current through the hall element 125. In addition, the hall element 125 sensitivity may be adjusted by controlling the current through the hall element 125. The hall element 125 may comprise any suitable material that responds to a magnetic field by outputting a voltage proportional to the magnetic field strength. The voltage generated by the hall element 125 may be referred to as the hall signal. According to various embodiments, the hall sensor circuit 145 may be coupled to and responsive to the driver circuit 105A/B. The sensor IC 100 may be configured to selectivity operate switches S1, S2, S3 in conjunction with various components of the hall sensor circuit 145, such as the plurality of switches, to facilitate a constant current through the hall element 125.

The sampling circuit 150 may be configured to perform various sampling functions of a signal, such as a hall signal from the hall sensor circuit 145. For example, the sampling circuit 150 may be coupled to and configured to receive the hall signal generated by the hall element 125. The sampling circuit 150 may comprise any circuit and/or system suitable for performing sampling operations. For example, the sampling circuit 150 may comprise any number of components, such as switches and capacitors, that operate in conjunction with each other to perform sampling functions.

According to an exemplary embodiment, the hall sensor circuit 145 is selectively coupled to the sampling circuit 150 via the first switching circuit 170 configured to couple/decouple the hall sensor circuit 145 to/from the sampling circuit 150. For example, the first switching circuit 170 may comprise one or more switches, such as an analog switch, transistor, or the like.

The first amplifier circuit 155 may be configured to amplify a signal, such as a sampled hall signal from the sampling circuit 150. For example, the first amplifier may be coupled to the sampling circuit 150. The first amplifier circuit 155 may comprise any circuit and/or system suitable for amplifying a signal. For example, the first amplifier circuit 155 may comprise a first op-amp 115 and various components, such as switches and capacitors, to operate in conjunction with the first op-amp 115 to amplify the sampled hall signal. The first amplifier circuit 155 may further comprise various components to selectively couple the first amplifier circuit 155 to the sampling circuit 150. For example, the first amplifier 155 and the sampling circuit 150 may be coupled via a switching device. According to an exemplary embodiment, the first amplifier circuit 155 is configured as a differential amplifier comprising an inverting input terminal (−), a non-inverting input terminal (+), a negative output terminal $V_{on}$ and a positive output terminal $V_{op}$. An output terminal of the first amplifier circuit 155 may be coupled to the second amplifier circuit 165.

The second amplifier circuit 165 may be configured to further amplify the hall signal. For example, an input of the second amplifier circuit 165 may be coupled to the output of the first amplifier circuit 155, such that the second amplifier circuit 165 amplifies the hall signal a second time. The second amplifier circuit 165 may comprise any circuit and/or system suitable for amplifying a signal. In an exemplary embodiment, the second amplifier circuit 165 may comprise a second op-amp 120 configured to amplify an output signal of the first amplifier circuit 155. The second amplifier circuit 165 may be selectively coupled to the first amplifier circuit 155 via the second switching circuit 110. The second amplifier circuit 165 may be further coupled to the driver circuit 105A/B. For example, a non-inverting terminal (+) of the second op-amp 120 may be coupled to the control circuit 140A/B to receive a constant voltage, which provides an offset voltage to the second op-amp 120. The second amplifier circuit 165 may generate an output voltage VHout.

The second switching circuit 110 may be configured to selectively couple the first amplifier circuit 155 to the second amplifier circuit 165. The second switching circuit 110 may comprise any circuit and/or device suitable for electrically coupling/decoupling the first amplifier circuit 155 to/from the second amplifier circuit 165 and/or suitable for stabilizing the output voltage VHout. For example, the second switching circuit 110 may comprise a plurality of switches S4, S5, S6, S7. The switches S4 and S5 may be individually operated by the controller (not shown) to couple the output terminals of the first op-amp 115 to the input terminals of the second op-amp 120. Similarly, switches S6 and S7 may be individually operated by the controller to couple the second op-amp 120 to the driver circuit 105A/B to stabilize the output voltage VHout. Each switch S4, S5, S6, S7 may comprise any device and/or circuit suitable for electrically coupling/decoupling various circuit components, such as an analog switch, a transistor, and the like.

According to various embodiments, and referring to FIGS. 1-10A-D, the sensor IC 100 is capable of operating in a current mode and a voltage mode. During the current mode, the sensor IC 100 may perform sampling and a first amplification, and during the voltage mode, the sensor IC 100 may perform a second amplification. According to various embodiments, sensor IC 100 operates in one mode at a time. The sensor IC may further operate to provide a first transition period between a current mode and a voltage mode, and a second transition period between a voltage mode and a subsequent current mode. According to an exemplary embodiment, the sensor IC 100 may cyclically operate between the current mode, the first transition period, the voltage mode, and the second transition period.

In an exemplary operation, and referring to FIGS. 4, 5, and 8, 9, and 10A-D, during the current mode, the driver circuit 105A/B generates a constant current to control the sensitivity of the hall sensor circuit 145. According to one embodiment, and referring to FIG. 5, the amplifier 135 generates and supplies a bias voltage to the gate terminals of the transistors M4 and M5, which controls the current through transistors M4 and M5 and the sensor circuit 145. Additionally, switch Si is open (OFF), switch S2 is closed (ON), switch S3 is closed (ON). This results in transistor M3 being off, while transistors M4 and M5 are on, thereby allowing current to flow through the hall sensor circuit 145. During the current mode, the sensor IC 100 also samples and amplifies the hall signal. For example, the sampling circuit 150 may sample the hall signal and the first amplifier circuit 155 may perform a first amplification of the sampled hall signal. According to an exemplary embodiment, the sensor IC 100 may perform sampling and amplification twice during the current mode. For example, the sensor IC 100 may sample at 0 degrees and amplify, and then sample again at 90 degrees and amplify.

According to an exemplary embodiment, during the current mode, the second amplifier circuit 165 is decoupled from the first amplifier circuit 155 to prevent current from flowing from the first amplifier circuit 155 to the second amplifier circuit and/or the driver circuit 105A/B. For example, the switches S4 and S5 of the second switching circuit 110 may be selectively operated to decouple the second amplifier circuit 165. Unintended current flowing from the first amplifier circuit 155 back to the driver circuit 105A/B during the current mode may result in an inaccurate hall signal and therefore an inaccurate voltage output VHout. Further, switches S6 and S7 are closed (ON) to stabilize the output voltage of the second amplifier circuit 165.

During the voltage mode, and referring to FIGS. 2, 3, 6, 7, 9, and 10A-D, the driver circuit 105A/B supplies a constant voltage to the second amplifier circuit 165. According to one embodiment, and referring to FIG. 6, transistor M3 is turned on to generate the constant voltage. For example, the amplifier 135 supplies a bias voltage to the gate terminal of transistor M3 by closing switch S1, opening switch S2, and opening switch S3.

According to an exemplary embodiment, this arrangement provides the constant voltage required for the second amplifier circuit 165 to operate and perform a second amplification of the hall signal. During the voltage mode, the second amplifier circuit 165 amplifies the hall signal again, for example, after the first amplifier circuit 155 amplifies the hall signal, and generates the output voltage VHout. Therefore, switches S4 and S5 are closed to couple the first amplifier circuit 155 to the second amplifier circuit 165. Further, switches S6 and S7 may be open to ensure proper operation of the driver circuit 105A/B.

Referring to FIGS. 2, 9, and 10A-D, the operation may further comprise a first transition period between the current mode and the voltage mode, and a second transition period between the voltage mode and the current mode. During the first transition period, switches S4 and S5 are closed and switches S6 and S7 are open to ensure that the output voltage VHout is stabilized and changes gradually. Similarly, during the second transition period, switches S4 and S5 are open, while switches S6 and S7 are closed to stabilize the output voltage VHout and ensure that it changes gradually before the driver circuit 105A operates in a current mode.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An integrated circuit, comprising:
a sensor circuit; and
a driver circuit coupled to the sensor circuit and comprising:
an amplifier configured to generate a bias voltage at a bias output terminal;
a signal converter circuit coupled to the amplifier, wherein the signal converter circuit comprises a digital-to-analog converter; and
a control circuit coupled to the amplifier and configured to selectively operate the driver circuit in one of:
a current mode; and
a voltage mode.

2. The integrated circuit according to claim 1, wherein the control circuit comprises:
a plurality of switches, each responsive to a control signal; and
at least one transistor coupled to at least one of the plurality of switches.

3. The integrated circuit according to claim 1, wherein the control circuit comprises:
a first switch coupled:
in series with a second switch; and
to the bias output terminal;
a third transistor comprising a gate terminal, wherein the gate terminal is coupled to a node positioned between the first and second switches; and
a third switch and a resistive element coupled between a reference voltage and the amplifier.

4. The integrated circuit according to claim 1, wherein the sensor circuit comprises a hall element configured to generate a hall signal in response to a magnetic field.

5. The integrated circuit according to claim 1, further comprising a switching circuit coupled to the sensor circuit and the driver circuit and responsive to a control signal.

6. The integrated circuit according to claim 1, wherein:
the signal converter circuit is coupled to an inverting terminal of the amplifier; and
the control circuit is coupled to:
a non-inverting terminal of the amplifier; and
a bias output terminal of the amplifier.

7. The integrated circuit according to claim 1, further comprising:
a first amplifier circuit coupled to an output of the sensor circuit;
a second amplifier circuit coupled to an output of the first amplifier circuit and the driver circuit; and
a switching circuit coupled:
between the first and second amplifier circuits; and
to the driver circuit;
wherein the switching circuit comprises a plurality of switches.

8. The integrated circuit according to claim 7, wherein the switching circuit comprises:
a fourth switch coupled between a first output terminal of the first amplifier circuit and a first terminal of the second amplifier circuit; and
a fifth switch coupled between a second output terminal of the first amplifier circuit and a second terminal of the second amplifier circuit.

9. The integrated circuit according to claim 8, wherein the switching circuit further comprises:
a sixth switch coupled between the fourth switch and the driver circuit; and
a seventh switch coupled to:
the fifth switch;
the driver circuit; and
the first input terminal of the first amplifier circuit.

10. A method for operating a hall sensor integrated circuit, comprising:
generating a current with a driver circuit, comprising:
a signal converter comprising a digital-to-analog converter;
an amplifier coupled to the signal converter; and
a control circuit coupled to the amplifier;
generating a sensor signal with the hall sensor;
decoupling a first amplifier circuit from a second amplifier circuit;
generating a voltage with the driver circuit; and
coupling the first amplifier circuit to the second amplifier circuit.

11. The method according to claim 10, further comprising generating a bias voltage with the amplifier.

12. The method according to claim 11, wherein:
generating the voltage comprises coupling the control circuit to the bias voltage; and
generating the current comprises decoupling the control circuit from the bias voltage.

13. The method according to claim 10, further comprising:
sampling the sensor signal with a sampling circuit;
amplifying the sampled sensor signal with the first amplifier circuit; and amplifying a signal from the first amplifier circuit with the second amplifier circuit.

14. A hall sensor integrated circuit, comprising:
a hall sensor circuit configured to generate a hall signal in response to a magnetic field;
a driver circuit coupled to the hall sensor circuit and configured to operate in one of:
 a current mode; and
 a voltage mode;
 wherein the driver circuit comprises:
  a control circuit coupled to a bias voltage;
a first amplifier circuit coupled to an output of the hall sensor circuit;
a second amplifier circuit coupled to the driver circuit; and
a switching circuit coupled between an output of the first amplifier circuit and an input of the second amplifier circuit, comprising:
 a plurality of switches, wherein each switch is responsive to a dedicated control signal.

15. The hall sensor integrated circuit according to claim 14, wherein the driver circuit further comprises:
a signal converter; and
an amplifier coupled to the signal converter, comprising:
 an inverting input terminal;
 a non-inverting input terminal; and
 a bias output terminal;
 wherein the amplifier is configured to generate the bias voltage.

16. The hall sensor integrated circuit according to claim 14, wherein the control circuit further comprises:
a first switch coupled to the bias voltage;
a second switch coupled in series with the first switch;
a third transistor comprising a gate terminal, wherein the gate terminal is coupled to a node positioned between the first and second switches; and
a third switch and a resistive element coupled between a reference voltage and the amplifier;
wherein each of the first, second, and third switches are responsive to a dedicated control signal.

17. The hall sensor integrated circuit according to claim 14, wherein the switching circuit comprises:
a fourth switch coupled between a first output terminal of the first amplifier circuit and a first terminal of the second amplifier circuit; and
a fifth switch coupled between a second output terminal of the first amplifier circuit and a second terminal of the second amplifier circuit.

18. The hall sensor integrated circuit according to claim 17, wherein the switching circuit further comprises:
a sixth switch coupled to:
 the fourth switch;
 the driver circuit; and
 the first input terminal of the second amplifier circuit; and
a seventh switch coupled to:
 the fifth switch;
 the driver circuit; and
 the second input terminal of the second amplifier circuit.

19. The hall sensor integrated circuit according to claim 14, wherein the driver circuit further comprises a current mirror coupled to:
the hall sensor circuit; and
the amplifier.

20. The hall sensor integrated circuit according to claim 14, further comprising:
a signal converter circuit; and
an amplifier comprising:
 an inverting input terminal;
 a non-inverting input terminal; and
 a bias output terminal;
wherein:
 the signal converter circuit is coupled to the inverting terminal of the amplifier; and
 the control circuit is coupled to:
  the non-inverting terminal of the amplifier; and
  the bias output terminal of the amplifier.

* * * * *